(12) United States Patent
Perault et al.

(10) Patent No.: US 8,746,142 B2
(45) Date of Patent: Jun. 10, 2014

(54) STENCIL WIPER SPOT CLEANER ASSEMBLY AND RELATED METHOD

(75) Inventors: Joseph A. Perault, Natick, MA (US); Robert Ciocca, Woonsocket, RI (US)

(73) Assignee: Illinois Tool Works Inc., Glenview, IL (US)

( * ) Notice: Subject to any disclaimer, the term of this patent is extended or adjusted under 35 U.S.C. 154(b) by 52 days.

(21) Appl. No.: 13/534,641

(22) Filed: Jun. 27, 2012

(65) Prior Publication Data

US 2014/0000468 A1    Jan. 2, 2014

(51) Int. Cl.
  *B41F 35/00*  (2006.01)
(52) U.S. Cl.
  CPC .................... *B41F 35/005* (2013.01)
  USPC .......................... 101/425; 101/483
(58) Field of Classification Search
  CPC ..................................... B41F 35/005
  USPC ....................................... 101/425
  See application file for complete search history.

(56) References Cited

U.S. PATENT DOCUMENTS

| | | | | |
|---|---|---|---|---|
| 3,999,239 | A | * | 12/1976 | Misuna .............................. 15/88 |
| 4,922,820 | A | * | 5/1990 | Grossmann et al. ........... 101/425 |
| 5,701,821 | A | * | 12/1997 | Asai et al. ...................... 101/425 |
| 5,918,544 | A | | 7/1999 | Doyle |
| 6,626,106 | B2 | | 9/2003 | Peckham et al. |
| 6,634,290 | B1 | * | 10/2003 | Shimizu et al. ............... 101/425 |
| 6,955,121 | B2 | | 10/2005 | Perault et al. |
| 7,017,489 | B2 | | 3/2006 | Perault et al. |
| 7,032,513 | B2 | * | 4/2006 | Onishi et al. .................. 101/425 |
| 7,040,228 | B2 | | 5/2006 | Perault et al. |
| 8,191,472 | B2 | * | 6/2012 | Mizuno et al. ................ 101/126 |
| 2004/0238003 | A1 | | 12/2004 | Pham-Van-Diep et al. |
| 2012/0145013 | A1 | | 6/2012 | Doyle |
| 2012/0145014 | A1 | | 6/2012 | Doyle |
| 2012/0145015 | A1 | | 6/2012 | Doyle |
| 2012/0145016 | A1 | | 6/2012 | Doyle |

FOREIGN PATENT DOCUMENTS

WO    2012/053180 A1    4/2012

OTHER PUBLICATIONS

Notification of Transmittal of the International Search Report and the Written Opinion of the International Searching Authority from corresponding PCT/US2013/047214 mailed Oct. 7, 2013.

* cited by examiner

*Primary Examiner* — Anthony Nguyen
(74) *Attorney, Agent, or Firm* — Lando & Anastasi, LLP

(57) ABSTRACT

A stencil printer includes a stencil having a top surface and a bottom surface, a material applicator to apply material on the top surface of the stencil, and a stencil wiper assembly to clean the bottom surface of the stencil in a y-axis direction. The stencil wiper assembly has a wiper blade assembly configured to engage the bottom surface of the stencil and wipe the bottom surface of the stencil when moving the stencil wiper blade assembly along a stencil wiper gantry. The stencil wiper assembly further includes a spot cleaner assembly movably secured to the stencil wiper assembly. The spot cleaner assembly is configured to move in an x-axis direction and to spot clean the bottom of the stencil. A method for spot cleaning a stencil is further disclosed.

20 Claims, 7 Drawing Sheets

STENCIL WIPER SPOT CLEANER ASSEMBLY AND RELATED METHOD

BACKGROUND OF INVENTION

1. Field of Invention

The present invention relates generally to stencil printers and stencil cleaning methods and apparatus, and more particularly to a stencil cleaning assembly that is capable of providing localized cleaning of the stencil.

2. Discussion of Related Art

In a typical surface-mount circuit board manufacturing operation, a stencil printer is used to print solder paste onto a circuit board having a pattern of pads or some other conductive surface onto which solder paste will be deposited. The circuit board is automatically fed into the stencil printer and one or more small holes or marks on the circuit board, called fiducials, is used to properly align the circuit board with the stencil or screen of the stencil printer prior to the printing of solder paste onto the circuit board. Once a circuit board has been properly aligned with the stencil in the printer, the circuit board is raised to the stencil, solder paste is dispensed onto the stencil, and a wiper blade (or squeegee) traverses the stencil to force the solder paste through apertures formed in the stencil and onto the board. As the wiper blade is moved across the stencil, the solder paste tends to roll in front of the blade, which desirably causes mixing and shearing of the solder paste so as to attain desired viscosity to facilitate filling of the apertures in the screen or stencil. The solder paste is typically dispensed onto the stencil from a standard cartridge. In other embodiments, a pressurized head may be provided to dispense solder paste to apertures in the stencil.

In some prior art stencil printers, any excess solder paste remaining under the squeegee after it has fully traversed the stencil remains on the stencil when the squeegee is returned to its initial position for printing on a second circuit board. Usually, as the squeegee passes the solder paste over the stencil, minute amounts of solder paste seep through the apertures to accumulate at the bottom side of the stencil. This presents various problems, such as the solder paste being inadvertently disposed on the unintended areas of the circuit boards. Also, as the solder paste hardens, it complicates the alignment procedure of a circuit board with the stencil. Therefore, it is highly desirable to remove the excess solder paste that forms on the bottom of the stencil.

Most stencil printers employ stencil cleaners to clean the underside of the stencil. U.S. Pat. No. 5,918,544 to Doyle represents one prior art stencil printer having a well-known method and apparatus for cleaning the bottom of the stencil. Doyle discloses a wiping system that is positioned near the vicinity of the stencil and moves beneath the stencil from one end of the stencil to the other end. As the stencil wiper system moves beneath the stencil, it wipes off excess solder paste at the bottom of the stencil. Specifically, the stencil wiper system includes a paper supply roller containing a roll of paper, a take-up roller, a pair of paper guide rollers, a hollow solvent tube with numerous small openings formed along the length of the tube, and a vacuum plenum for removing excess moisture and hardened solder paste from the paper as it travels underneath the stencil. During a cleaning operation, a paper winder motor rotates the take-up roller to draw paper from the paper supply roller, which passes paper through the pair of paper guide rollers. The hollow solvent tube is located between the paper guide rollers and is filled with solvent by a solvent pump, which causes the solvent tube to squirt solvent through its numerous holes onto the paper as it passes the solvent tube. The solvent impregnated paper is passed to the vacuum plenum, which holds the paper in place as the stencil moves over the paper, thereby cleaning the stencil. The roll of paper has a width that is sufficient to clean the majority of the underside of the stencil.

U.S. Pat. Nos. 6,626,106, 6,955,121, 7,017,489, and 7,040,228 disclose improvements to the traditional stencil cleaner.

SUMMARY OF INVENTION

Embodiments of the invention provide improvements to stencil cleaning assembly, such as those described above.

One aspect of the disclosure is directed to a stencil printer comprising a stencil having a top surface and a bottom surface, a material applicator to apply material on the top surface of the stencil, and a stencil wiper assembly to clean the bottom surface of the stencil in a y-axis direction. The stencil wiper assembly has a wiper blade assembly configured to engage the bottom surface of the stencil and wipe the bottom surface of the stencil when moving the stencil wiper blade assembly along a stencil wiper gantry. In one embodiment, the stencil wiper assembly further includes a spot cleaner assembly movably secured to the stencil wiper assembly. The spot cleaner assembly is configured to move in an x-axis direction and to spot clean the bottom of the stencil.

Embodiments of the stencil printer further include providing a spot cleaner assembly having a frame member secured to a frame of the stencil wiper assembly. The spot cleaner assembly further may include a carriage supported by a support bracket configured to ride along the frame member, and/or an x-axis drive configured to move the support bracket. The x-axis drive may include a ball screw rotatably driven by a motor. The spot cleaner assembly further may include a controller configured to control the movement of the stencil wiper assembly and the spot cleaner assembly to position the spot cleaner assembly at a desired location to perform a spot cleaning operation. The spot cleaner assembly further may include a cleaning head supported by the carriage. The cleaning head further may include a replaceable media to collect excess solder paste and flux. The replaceable media may include wiper paper or sponge material. The cleaning head further may include a solvent dispensing system to wet the replaceable media. The cleaning head may be configured to agitate or rotate to loosen solder paste and flux affixed to the stencil, and a vacuum system to draw air through the stencil into the media of the cleaning head. The spot cleaner assembly further may include an actuator configured to move the cleaning head in a z-axis direction. The stencil printer further may comprise a controller configured to control the movement of the stencil wiper assembly and the cleaning head of the spot cleaner assembly to position the cleaning head at a desired location to perform a spot cleaning operation. The cleaning head of the spot cleaner assembly is controlled by the controller to move along a user defined path that removes flux residue and solder paste from the bottom surface of the stencil.

Another embodiment of the present disclosure is directed to a method of cleaning a stencil of a stencil printer. In one embodiment, the method comprises: moving a stencil wiper assembly to clean a bottom surface of the stencil in a y-axis direction, the stencil wiper assembly having a wiper blade assembly configured to engage the bottom surface of the stencil and wipe the bottom surface of the stencil when moving the stencil wiper blade assembly along a stencil wiper gantry; and moving a spot cleaner assembly, coupled to the stencil wiper assembly, in an x-axis direction, the spot cleaner assembly being configured to spot clean the bottom of the stencil.

Embodiments of the method may further comprise controlling the movement of the stencil wiper assembly and the cleaning head of the spot cleaner assembly to position a cleaning head at a desired location to perform a spot cleaning operation. The controlling the movement of the stencil wiper assembly and the cleaning head of the spot cleaner assembly may include moving the cleaning head along a user defined path that removes flux residue and solder paste from the bottom surface of the stencil. The moving of the cleaning head along a user defined path includes pre-programmed paths. The method further may comprise controlling the operation of a solvent dispensing system, agitation/rotation of the cleaning head, and a vacuum system of the spot cleaner assembly. The method further may comprise inspecting one of a printed circuit board and the stencil to detect a defect.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

For purposes of illustration, embodiments of the present invention will now be described with reference to a stencil printer used to print solder paste onto a circuit board. One skilled in the art will appreciate, however, that embodiments of the present invention are not limited to stencil printers that print solder paste onto circuit boards, but rather, may be used to print other viscous materials used to assembly electronic components onto electronic substrates. Also, the terms "screen" and "stencil" may be used interchangeably herein to describe a device in a printer that defines a pattern to be printed onto a substrate. In certain embodiments, the stencil printer may include an Accela® or Momentum® series stencil printer platform offered by Speedline Technologies, Inc. of Franklin, Mass.

Figure 1:
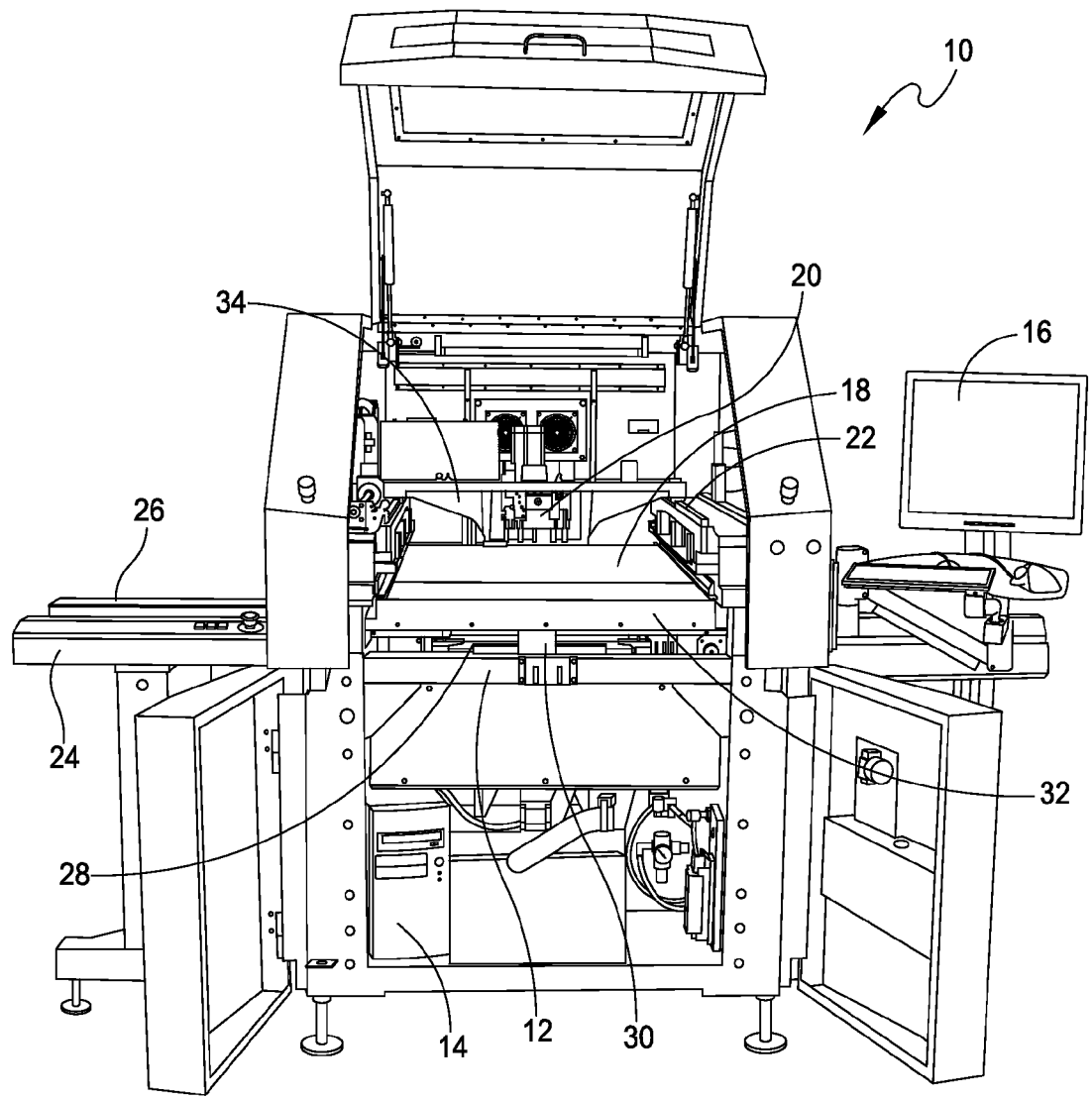
FIG. 1 shows a front perspective view of a stencil printer in which an embodiment of the present disclosure is implemented.

Referring now to the drawings, and more particularly to FIG. 1, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head assembly or print head 20, which is configured to apply the solder paste in a manner described in greater detail below.

As shown in FIG. 1 and described below, the stencil and the print head may be suitably coupled or otherwise connected to the frame 12. In one embodiment, the print head 20 may be mounted on a print head gantry 22, which may be mounted on the frame 12. The print head gantry 22 enables the print head 20 to be moved in the y-axis direction under the control of the controller 14 and to apply pressure on the print head as it engages the stencil 18. In one embodiment, the print head 20 may include a pair of squeegee blades that are placed over the stencil 18 and lowered in the z-axis direction into contact with the stencil so that the squeegee blades sealingly engage the stencil. Once engaged, the squeegee blades of the print head 20 are moved by means of the gantry 22 across the stencil 18 to allow printing of solder paste onto a circuit board through apertures formed in the stencil.

The stencil printer 10 may also include a conveyor system having rails 24, 26 for transporting a printed circuit board (sometimes referred to as a "printed wiring board," "substrate," or "electronic substrate" herein) to a print position in the stencil printer. The rails 24, 26 sometimes may be referred to herein as a "tractor feed mechanism," which is configured to feed, load or otherwise deliver circuit boards to the working area of the stencil printer, which may be referred to herein as a "print nest," and to unload circuit boards from the print nest.

The stencil printer 10 has a support assembly 28 to support the circuit board, which raises and secures the circuit board so that it is stable during a print operation. In certain embodiments, the substrate support assembly 28 may further include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, the print head 20 may be configured to receive solder paste from a source, such as a dispenser, e.g., a solder paste cartridge, that provides solder paste to the print head during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft DOS or Windows XP operating system, with application specific software to control the operation of the stencil printer 10. The controller 14 may be networked with a master controller that is used to control a production line for fabricating circuit boards.

In one configuration, the stencil printer 10 operates as follows. A circuit board is loaded into the stencil printer 10 using the conveyor rails 24, 26. The support assembly 28 raises and secures the circuit board to a print position in the print nest. The print head 20 is then lowered in the z-axis direction until the blades of the print head contact the stencil 18 at a desired pressure. The print head 20 is then moved in the y-axis direction across the stencil 18 by the print head gantry 22. The print head 20 deposits solder paste through apertures in the stencil 18 and onto the circuit board. Once the print head has fully traversed the stencil 18 across the apertures, the print head is lifted off the stencil and the circuit board is lowered back onto the conveyor rails 24, 26 with the solder paste deposits left on the circuit board. The circuit board is released and transported from the stencil printer 10 so that a second circuit board may be loaded into the stencil printer. To print on the second circuit board, the print head is lowered in the z-axis direction into contact with the stencil and moved across the stencil 18 in the direction opposite to that used for the first circuit board.

Still referring to FIG. 1, an imaging system 30 may be provided for the purposes of aligning the stencil 18 with the circuit board prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back and forth movement of the imaging system 30 over the circuit board in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board to capture an image of predefined areas of the stencil or circuit board, respectively. In other embodiments, when positioning the imaging system outside the print position the imaging system may be located above or below the stencil and the circuit board.

Figure 2:
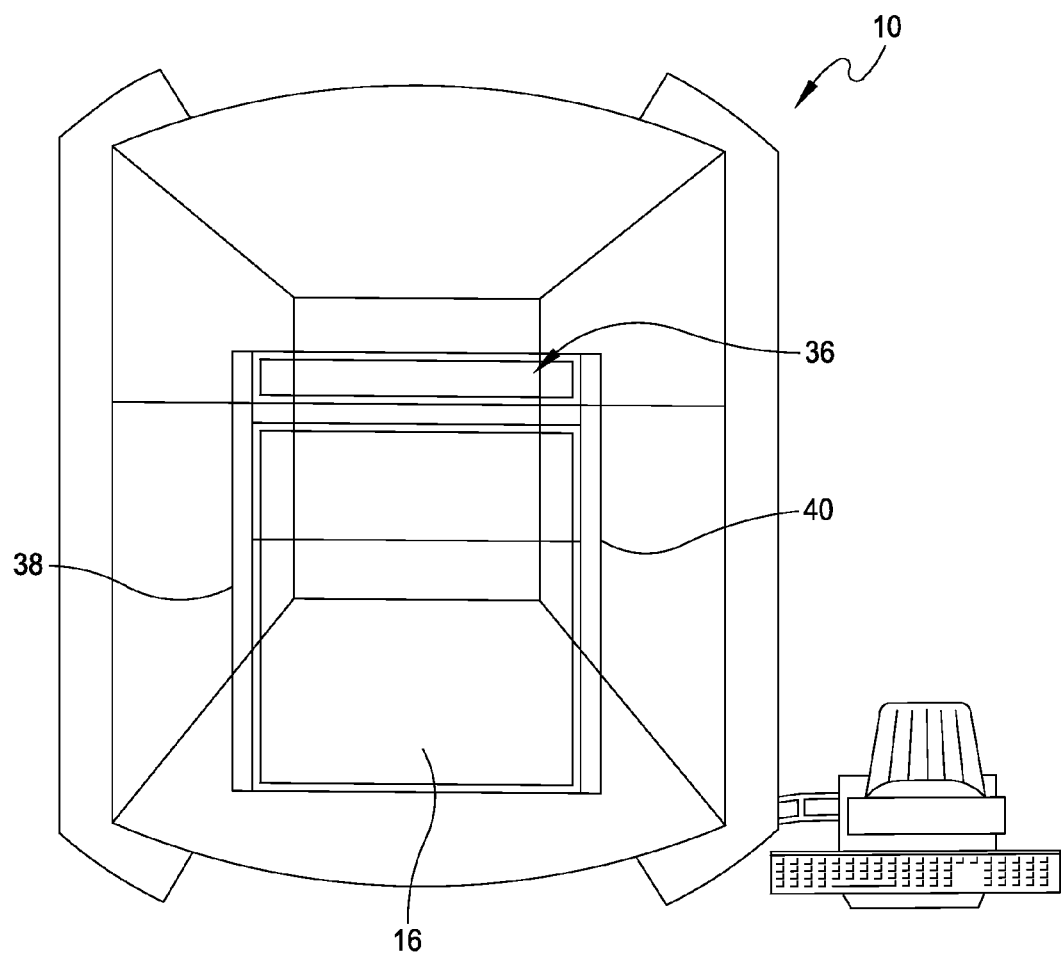
FIG. 2 shows a schematic top view of the stencil printer.

Referring to FIG. 2, after one or more applications of the solder paste to the circuit boards, excess solder paste accumulates at the bottom of the stencil, and a stencil wiper assembly, generally indicated at 36, is configured to move beneath the stencil 16 to remove the excess solder paste. The stencil wiper assembly 36 is mounted on a pair of rails 38, 40 and situated at one end (e.g., the back end as opposed to the front end which is illustrated in FIG. 1) of the stencil printer 10. According to one embodiment of the disclosure, the stencil wiper assembly 36 rides on linear rails 38, 40 and is moved back and forth using a rack and pinion mechanism. Alternatively, a motor and belt mechanism may be used to reciprocate the stencil wiper assembly 36, as well as chain and pulley linear motor, or any suitable alternative mechanism. The stencil wiper assembly 36 may also stay stationary as the stencil is moved over the mechanism to perform the cleaning operation. The construction of the components used to move the stencil wiper assembly 36 on the rails 38, 40 may be referred to as a stencil wiper gantry.

Figure 3:
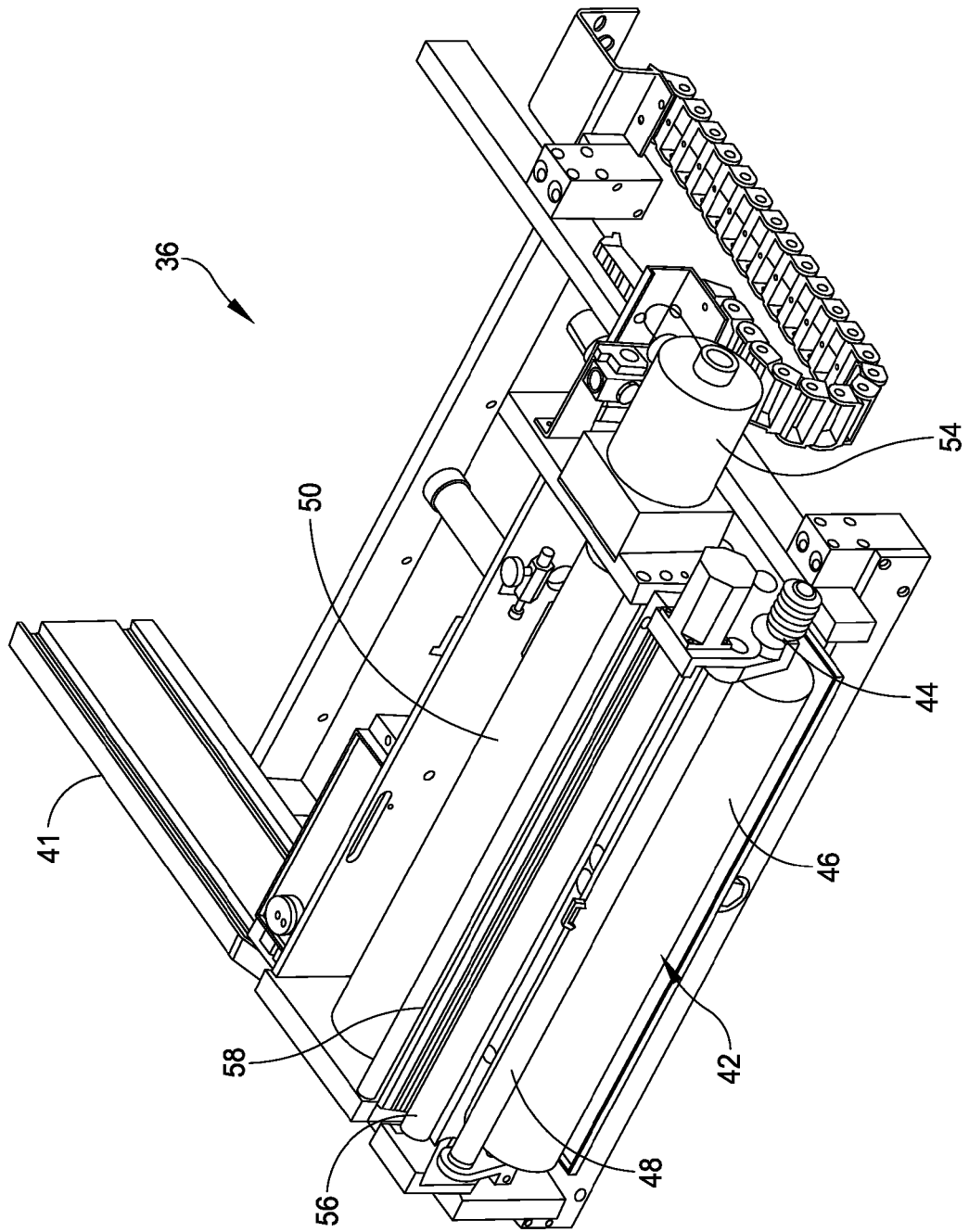
FIG. 3 shows a perspective view of a stencil wiper assembly of the stencil printer according to one embodiment of the disclosure.

Referring to FIG. 3, the stencil wiper assembly 36 includes a frame 41 and paper supply assembly, generally indicated at 42, which is supported by the frame. In one embodiment, the paper supply assembly includes a supply roller 44 having a roll of paper 46 housed thereon, at least one paper guide roller 48, a take-up roller 50 for receiving used paper, and a paper driver (not shown) having a material winder motor 54 for moving the paper across the stencil 16 in a linear direction from the supply roller 44 to the take-up roller 50. The stencil wiper assembly 36 further includes a fluid delivery tube 56 and a wiper blade assembly 58 having a vacuum plenum for removing excess moisture and hardened solder paste from the paper as it travels underneath the stencil 16. The fluid delivery tube 56 and the wiper blade assembly 58 are each suitably supported by the frame 41 in the manner depicted in FIG. 3. The wiper blade assembly 58 is configured to move the web of paper between a first position in which the paper is spaced away from the stencil to a second position in which the paper engages the stencil. It should be noted that in FIG. 3 the web of paper is not shown as it extends from the supply roller 44, over the guide roller 48, fluid delivery tube 56, wiper blade assembly 58, to the take-up roller 50, so as to more clearly illustrate these components. This configuration is well known in the art of stencil wiper assembly.

During a cleaning operation, the paper winder motor 54 rotates the paper supply roller 44, which passes paper over the guide roller 48. Between the paper guide roller 48 and the take-up roller 50, there is the fluid delivery tube 56 that is filled with solvent by a solvent pump, which is constructed to squirt solvent onto the paper as it passes over the fluid delivery tube 56. The solvent impregnated paper is passed to the wiper blade assembly 58, which holds the paper in place as the stencil 16 moves over the paper, thereby cleaning the stencil. After wetting the paper, the wiper blade assembly 58 engages the wetted paper to clean the underside of the stencil 16. The vacuum plenum of the wiper blade assembly 58 removes particles from the web of paper so as not to contaminate the printing operation. The wiper blade assembly 58 extends and retracts in response to control signals from the controller 14. The web of paper is advanced in response to control signals received from the controller 14 to move the paper across the wiper blade assembly 58.

The operation of the stencil wiper assembly 36 is as follows. The stencil wiper assembly 36 (or the stencil 16, as the case may be) is brought into position so that the stencil wiper assembly 36 can clean the underneath of the stencil 16. The controller 14 controls the movement of the web of paper across the fluid delivery tube 56 of the fluid delivery tube 56 and the wiper blade assembly 58. The stencil wiper assembly 36 is moved across the underneath of the stencil 16 on the rails 38, 40 to effect cleaning of the stencil. Alternatively, the stencil 16 can be moved across the stencil wiper assembly 36. Excess material wiped away from the stencil 16 is removed by the vacuum plenum of the wiper blade assembly 58.

Figure 4:
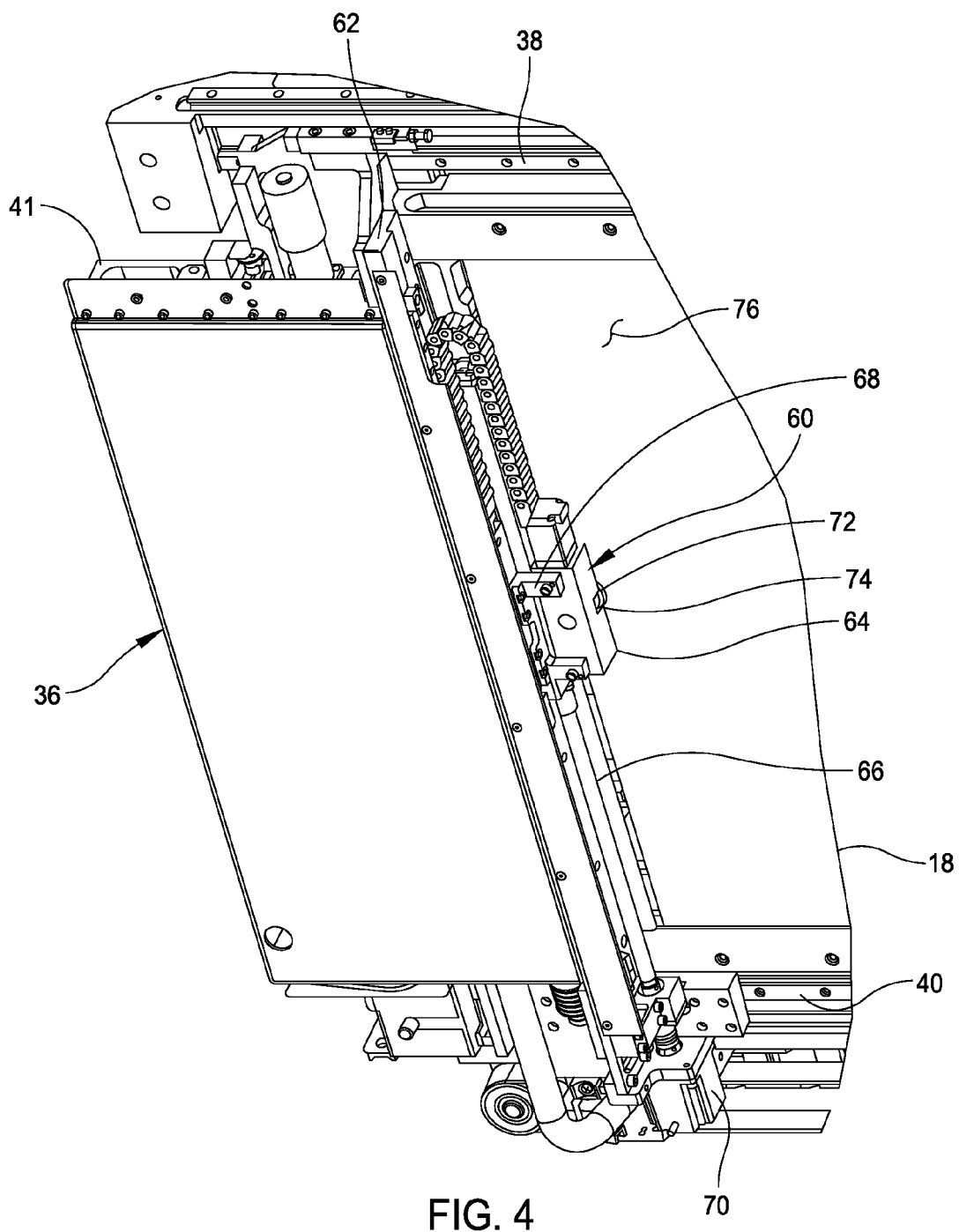
FIG. 4 is a perspective view of another embodiment of a stencil wiper assembly having a spot cleaner assembly of the present disclosure.
Figure 5:
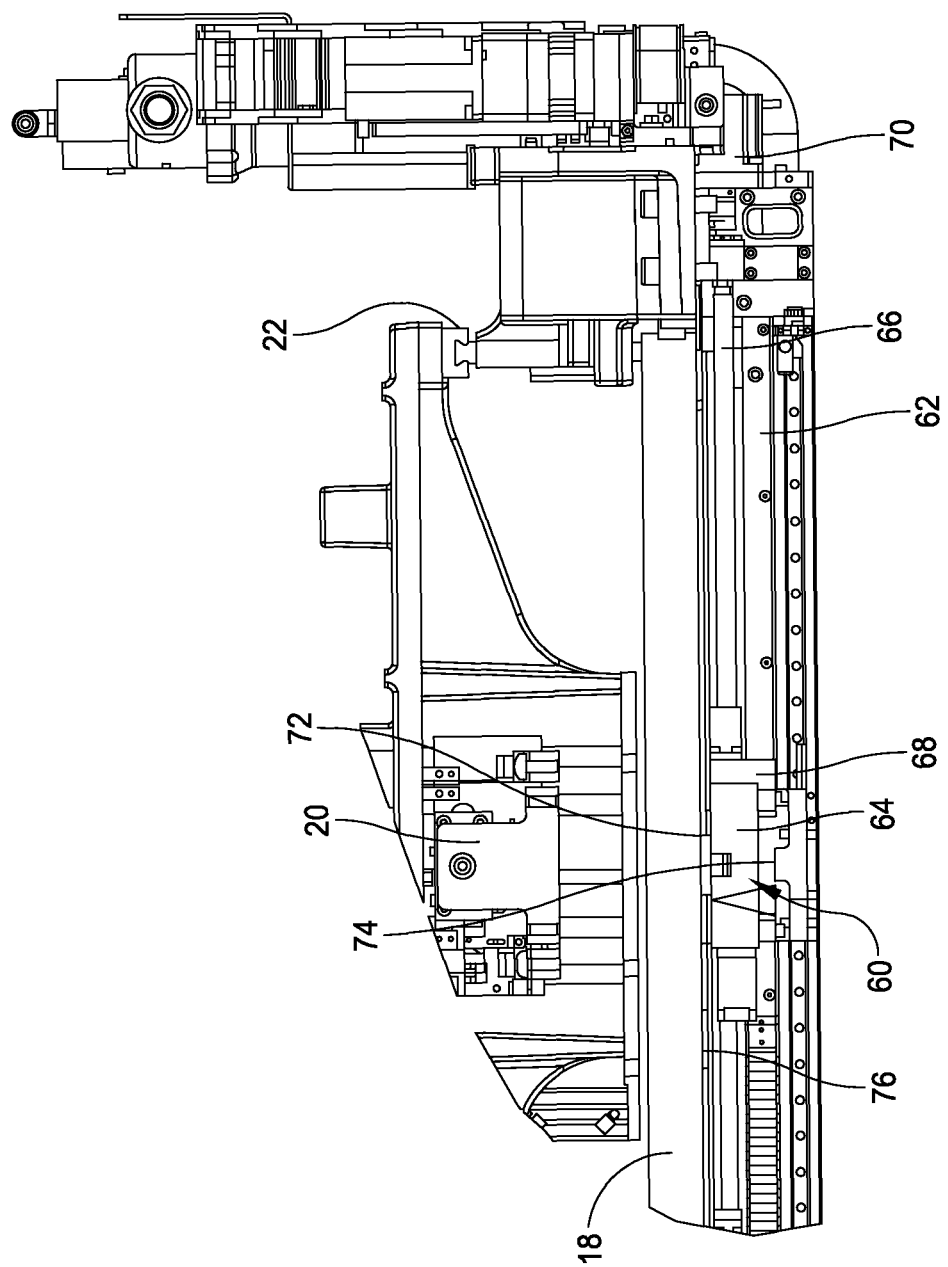
FIG. 5 is an elevational view illustrating the spot cleaner assembly shown in FIG. 4.

Referring to FIGS. 4 and 5, and more particularly to FIG. 4, the underside of the stencil wiper assembly 36 is shown to include an x-axis "spot" cleaner assembly, generally indicated at 60, that is supported by a frame member 62, which is secured to the frame 41 of the stencil wiper assembly 36. As shown, the spot cleaner assembly 60 includes a carriage 64 connected to an x-axis drive 66 by a support bracket 68, which is configured to ride along the frame member 62. The arrangement is such that the carriage 64 moves in an x-axis direction upon the activation of a motor 70, which forms a part of the spot cleaner assembly 60. In one embodiment, the x-axis drive 66 may embody a ball screw, which is rotated by the motor 70, to drive the linear movement of the carriage 64 along an edge of the stencil wiper assembly 36. Thus, the carriage 64 of the spot cleaner assembly 60 is capable of moving in the y-axis direction under control of the stencil wiper assembly 36 along rails 38, 40, and in the x-axis direction under the control of the x-axis drive 66. As a result, the carriage 64 of the spot cleaner assembly 60 may be positioned at any desirable location under the stencil 18 to perform a spot cleaning operation as discussed below.

Referring to FIG. 5, the carriage 64 of the spot cleaner assembly 60 includes a cleaning head 72, which is supported by the carriage and configured to move in a z-axis direction by an actuator 74. In one embodiment, the cleaning head 72 of the spot cleaner assembly 60 is controlled by the controller 14 to move along a user defined path that removes flux residue and solder paste from a bottom surface 76 of the stencil 18. The carriage 64 having the cleaning head 72 is driven by the stencil wiper assembly 36 and the x-axis drive 66 along two axes that are parallel to the stencil 18. The controller 14 enables an operator of the stencil printer 10 to select areas of the bottom surface 76 of the stencil 18 for increased or decreased exposure to the cleaning head 72 of the spot cleaner assembly 60. The operator is able to control the direction of travel of the cleaning head 72 by manipulating the operation of the carriage 64 by the x-axis drive 66 and the z-axis actuator 74.

In one embodiment, the cleaning head 72 includes a replaceable media to collect excess solder paste and flux as the cleaning head cleans the bottom surface 76 of the stencil 18. Such media includes, and is not limited to, wiper paper or sponge material. The cleaning head 72 may include a solvent dispensing system to wet the media in the manner in which the web of paper is wetted as described above. The cleaning head 72 may be configured to agitate or rotate to loosen solder paste and flux affixed to the stencil 18, and to include a vacuum system to draw air through the stencil into the media of the cleaning head.

As described, the controller 14 is configured to control the operation of the spot cleaner assembly 60, as with the other assemblies of the stencil printer 10. This includes controlling the path of the cleaning head 72 of the spot cleaner assembly 60. The controller 14 may be configured to enable pre-programmed paths and user-defined paths. The controller 14 further may be configured to control the operation of the solvent dispensing system, agitation/rotation of the cleaning head 72, and the vacuum system, either collectively or individually. These cleaning functions, and their respective intensities, may be programmed to operate by user-defined positions along the path of operation of the spot cleaner assembly 60. The controller 14 further may be configured to manipulate the imaging system 30 and the imaging gantry 32 to inspect the stencil 18 prior to cleaning and post-cleaning. The information gathered by the imaging system 30 during a pre-cleaning inspection may ensure the stencil 18 is clean by implementing a spot clean operation. Pre-cleaning and post-cleaning inspections may be independently selected or deselected by the operator or by the controller 14, as required.

This construction enables the spot cleaner assembly 60 to be used to fix a bridge detected by the imaging system 30 when inspecting a printed upon circuit board. Specifically, the imaging system 30 may be used to detect a bridge, the spot cleaner assembly 60 may be used to clean the stencil 18 causing the bridge, and the imaging system may be used to verify that the problem has been corrected.

Although the spot cleaner assembly 60 is shown to be secured to the gantry of the stencil wiper assembly 36, it should be observed that the spot cleaner assembly may be secured to other gantries of the stencil printer, including the imaging gantry 32.

Figure 6:
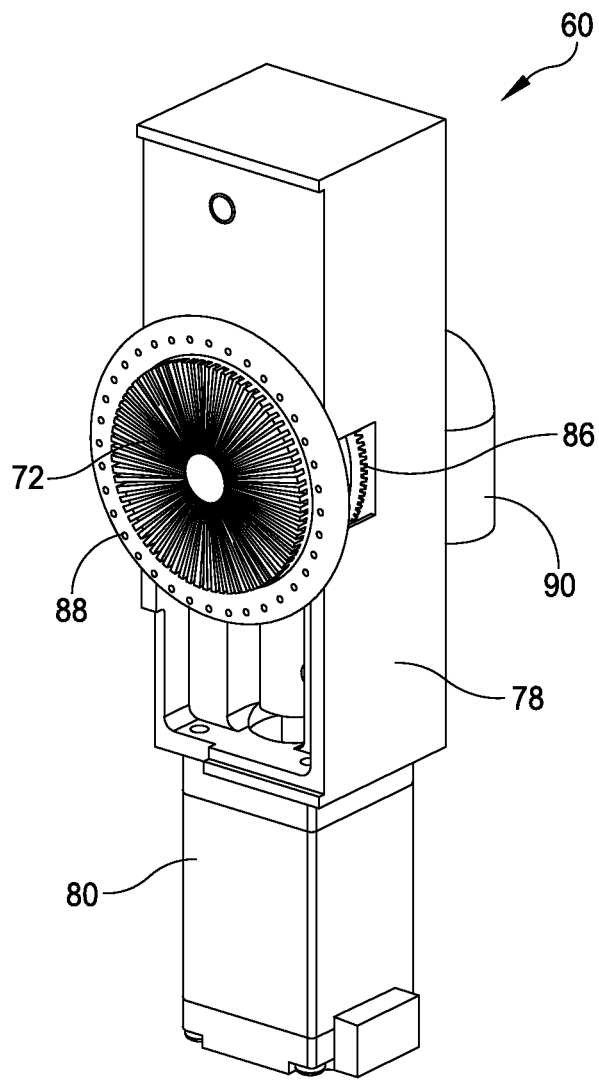
FIG. 6 is a perspective view of the spot cleaner assembly.
Figure 7:
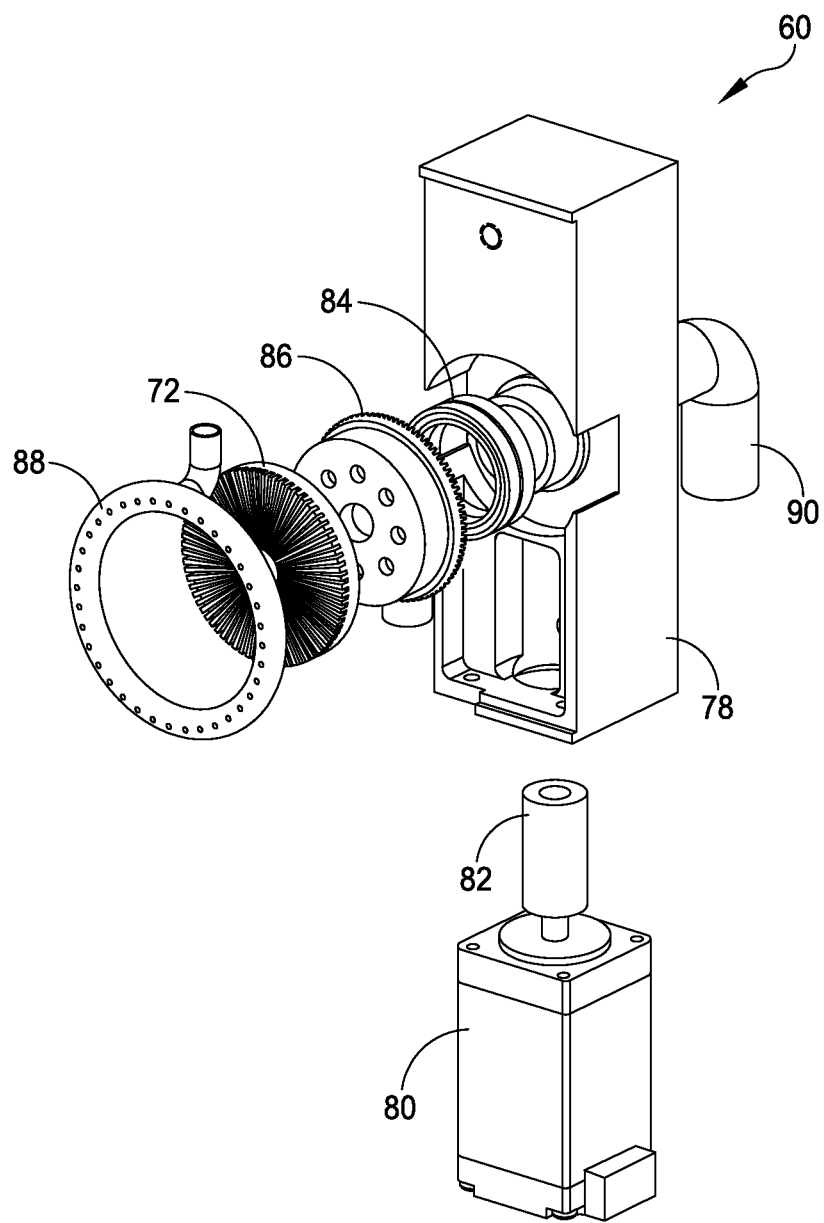
FIG. 7 is an exploded perspective view of the spot cleaner assembly.

FIGS. 6 and 7 illustrate one embodiment of the spot cleaner assembly 60 in greater detail. As shown, the spot cleaner assembly 60 includes a housing 78 that is configured to support the components of the spot cleaner assembly, and a drive motor 80 having a coupling 82 that is configured to mount on the housing and drive the operating components of the spot cleaner assembly. The motor drives the rotational movement of the spot cleaning head 72 by means of a drive bearing 84 and drive gear 86, which engages the coupling 82 connected to the motor. By rotating the cleaning head 72, the cleaning head agitates the stencil to loosen solder paste and flux that is affixed to the stencil.

In a certain embodiment, the spot cleaner assembly 60 includes a solvent distribution ring 88 to wet the replaceable media of the cleaning head 72. The solvent distribution ring 88 is suitably connected to a source of solvent material and includes a plurality of openings formed in the ring to dispense solvent material. In another embodiment, spot cleaner assembly 60 further includes a vacuum tube 90 to draw air through the stencil into the media of the cleaning head 72. The vacuum tube 90 is connected to a vacuum source of the stencil wiper assembly 36.

It should be observed that the spot cleaner assembly 60 of the present disclosure improves the manner in which the stencil 18 is cleaned, especially around protrusions of a cavity printing stencil, which is particularly difficult to clean. A cavity printing stencil has rectangular protrusions on the board side of the stencil, which are difficult to clean with a standard stencil wiper assembly. The provision of the spot cleaner assembly 60 decreases the frequency of stencil cleaning, and, along with post-inspection by the imaging system 30, assists with minimizing circuit board bridge defects due to compromised stencils. These improvements will increase productivity of the stencil printer as measured by circuit boards that pass inspection.

Embodiments are not limited in their application to the details of construction and the arrangement of components set forth in the following description or illustrated in the drawings. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only.

What is claimed is:

1. A stencil printer comprising:
    a stencil having a top surface and a bottom surface;
    a material applicator to apply material on the top surface of the stencil;
    a stencil wiper assembly to clean the bottom surface of the stencil in a y-axis direction, the stencil wiper assembly having a wiper blade assembly configured to engage the bottom surface of the stencil and wipe the bottom surface of the stencil when moving the stencil wiper blade assembly along a stencil wiper gantry; and
    a spot cleaner assembly movably secured to the stencil wiper assembly, the spot cleaner assembly being configured to move in an x-axis direction and to spot clean the bottom of the stencil.

2. The stencil printer of claim 1, wherein the spot cleaner assembly includes a frame member secured to a frame of the stencil wiper assembly.

3. The stencil printer of claim 2, wherein the spot cleaner assembly further includes a carriage supported by a support bracket configured to ride along the frame member.

4. The stencil printer of claim 3, wherein the spot cleaner assembly further includes an x-axis drive configured to move the support bracket.

5. The stencil printer of claim 4, wherein the x-axis drive includes a ball screw rotatably driven by a motor.

6. The stencil printer of claim 5, further comprising a controller configured to control the movement of the stencil wiper assembly and the spot cleaner assembly to position the spot cleaner assembly at a desired location to perform a spot cleaning operation.

7. The stencil printer of claim 4, wherein the spot cleaner assembly further includes a cleaning head supported by the carriage.

8. The stencil printer of claim 7, wherein the cleaning head includes a replaceable media to collect excess solder paste and flux.

9. The stencil printer of claim 8, wherein the replaceable media includes wiper paper or sponge material.

10. The stencil printer of claim 8, wherein the cleaning head further includes a solvent dispensing system to wet the replaceable media.

11. The stencil printer of claim 8, wherein the cleaning head is configured to agitate or rotate to loosen solder paste and flux affixed to the stencil, and wherein the cleaning head further includes a vacuum system to draw air through the stencil into the media of the cleaning head.

12. The stencil printer of claim 7, wherein the spot cleaner assembly further includes an actuator configured to move the cleaning head in a z-axis direction.

13. The stencil printer of claim 12, further comprising a controller configured to control the movement of the stencil wiper assembly and the cleaning head of the spot cleaner assembly to position the cleaning head at a desired location to perform a spot cleaning operation.

14. The stencil printer of claim 13, wherein the cleaning head of the spot cleaner assembly is controlled by the controller to move along a user defined path that removes flux residue and solder paste from the bottom surface of the stencil.

15. A method of cleaning a stencil of a stencil printer, the method comprising:

moving a stencil wiper assembly to clean a bottom surface of the stencil in a y-axis direction, the stencil wiper assembly having a wiper blade assembly configured to engage the bottom surface of the stencil and wipe the bottom surface of the stencil when moving the stencil wiper blade assembly along a stencil wiper gantry; and moving a spot cleaner assembly, coupled to the stencil wiper assembly, in an x-axis direction, the spot cleaner assembly being configured to spot clean the bottom of the stencil.

16. The method of claim 15, further comprising controlling the movement of the stencil wiper assembly and the spot cleaner assembly to position a cleaning head of the spot cleaner assembly at a desired location to perform a spot cleaning operation.

17. The method of claim 16, wherein controlling the movement of the stencil wiper assembly and the cleaning head of the spot cleaner assembly includes moving the cleaning head along a user defined path that removes flux residue and solder paste from the bottom surface of the stencil.

18. The method of claim 17, wherein moving the cleaning head along a user defined path includes pre-programmed paths.

19. The method of claim 18, further comprising controlling the operation of a solvent dispensing system, agitation/rotation of the cleaning head, and a vacuum system of the spot cleaner assembly.

20. The method of claim 15, further comprising inspecting one of a printed circuit board and the stencil to detect a defect.

* * * * *